United States Patent
Anunciado

(10) Patent No.: US 11,579,535 B2
(45) Date of Patent: Feb. 14, 2023

(54) METHOD OF DETERMINING THE CONTRIBUTION OF A PROCESSING APPARATUS TO A SUBSTRATE PARAMETER

(71) Applicant: ASML NETHERLANDS B.V., Veldhoven (NL)

(72) Inventor: Roy Anunciado, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/286,020

(22) PCT Filed: Sep. 26, 2019

(86) PCT No.: PCT/EP2019/076048
§ 371 (c)(1),
(2) Date: Apr. 16, 2021

(87) PCT Pub. No.: WO2020/099010
PCT Pub. Date: May 22, 2020

(65) Prior Publication Data
US 2021/0382400 A1    Dec. 9, 2021

(30) Foreign Application Priority Data
Nov. 12, 2018 (EP) ..................... 18205693

(51) Int. Cl.
*G03F 7/20* (2006.01)
(52) U.S. Cl.
CPC ...... *G03F 7/70558* (2013.01); *G03F 7/70625* (2013.01)
(58) Field of Classification Search
CPC ................ G03F 7/70558; G03F 7/70625
See application file for complete search history.

(56) References Cited

U.S. PATENT DOCUMENTS 6,952,253 B2  10/2005  Lof et al.
6,961,453 B2  11/2005  Yoon et al.
(Continued)

FOREIGN PATENT DOCUMENTS

| EP | 1628164 | 2/2006 |
|----|---------|--------|
| TW | 201633005 | 9/2016 |

(Continued)

OTHER PUBLICATIONS

International Search Report and Written Opinion issued in corresponding PCT Patent Application No. PCT/EP2019/076048, dated Nov. 11, 2019.

(Continued)

*Primary Examiner* — Deoram Persaud
(74) *Attorney, Agent, or Firm* — Pillsbury Winthrop Shaw Pittman, LLP

(57) ABSTRACT

A method for determining a contribution of a processing apparatus to a fingerprint of a parameter across a substrate, the method including: obtaining a delta image which relates to a difference between a first pupil image associated with inspection of a first feature on the substrate and a second pupil image associated with inspection of a second feature on the substrate, wherein the first and second features have different dose sensitivities; determining a rate of change of the difference in response to a variation of a dose used to form the first and second features; selecting a plurality of pixels within the delta image having a rate of change above a predetermined threshold; and determining the contribution using the determined rate of change and the delta image restricted to the plurality of pixels.

20 Claims, 5 Drawing Sheets

(56) References Cited

U.S. PATENT DOCUMENTS

| | | |
|---|---|---|
| 2007/0296960 A1 | 12/2007 | Den Boef et al. |
| 2008/0198380 A1 | 8/2008 | Straaijer et al. |
| 2009/0168062 A1 | 7/2009 | Straaijer |
| 2010/0007863 A1 | 1/2010 | Jordanoska |
| 2010/0328655 A1 | 12/2010 | Den Boef |
| 2011/0026032 A1 | 2/2011 | Den Boef et al. |
| 2011/0032500 A1 | 2/2011 | Straaijer |
| 2011/0102753 A1 | 5/2011 | Van De Kerkhof et al. |
| 2011/0102793 A1 | 5/2011 | Straaijer |
| 2011/0188020 A1 | 8/2011 | Den Boef |
| 2011/0249244 A1 | 10/2011 | Leewis et al. |
| 2012/0044470 A1 | 2/2012 | Smilde et al. |
| 2012/0044495 A1 | 2/2012 | Straaijer |
| 2013/0162996 A1 | 6/2013 | Straaijer et al. |
| 2013/0308142 A1 | 11/2013 | Straaijer |
| 2015/0293458 A1* | 10/2015 | Vanoppen ........... G03F 7/70558 355/53 |
| 2016/0161863 A1 | 6/2016 | Den Boef et al. |
| 2016/0370717 A1 | 12/2016 | Den Boef et al. |
| 2017/0023867 A1 | 1/2017 | Staals et al. |
| 2017/0315441 A1 | 11/2017 | Finders |

FOREIGN PATENT DOCUMENTS

| | | |
|---|---|---|
| WO | 2011012624 | 2/2011 |
| WO | 2014082938 | 6/2014 |
| WO | 2018153711 | 8/2018 |

OTHER PUBLICATIONS

Taiwanese Office Action issued in corresponding Taiwanese Patent Application No. 108137372, dated Jun. 29, 2020.

* cited by examiner

METHOD OF DETERMINING THE CONTRIBUTION OF A PROCESSING APPARATUS TO A SUBSTRATE PARAMETER

CROSS-REFERENCE TO RELATED APPLICATIONS

This application is the U.S. national phase entry of PCT Patent Application No. PCT/EP2019/076048 which was filed on Sep. 26, 2019, which claims the benefit of priority of European Patent Application No. 18205693.7 which was filed on Nov. 12, 2018, and which is incorporated herein in its entirety by reference.

TECHNICAL FIELD

The present invention relates to methods for determining a contribution of a processing apparatus to a fingerprint of a parameter across a first substrate. In particular, the invention relates to determining a calibration metric which may be used to calibrate a lithographic apparatus before or during use.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

A typical semiconductor fabrication process will include the basic steps of: depositing a film of photoresist (film deposition); baking the photoresist; exposing the photoresist to provide the requisite pattern; developing the exposed resist and etch the substrate. Fluctuations of the process may lead to undesired variation in the critical dimensions across the substrate and hence worsening of the critical dimension uniformity, CDU. CDU is a key parameter for assuring good performance and reliable functionality of any integrated circuit and maximizing this measure is a continual goal within the semiconductor fabrication industry.

The variation introduced by each process step may be unique to that process step and may be referred to as a fingerprint. The accumulative variation of all of the processing steps may be referred to as the combined fingerprint.

Various metrology methods are known for determining the combined fingerprint. One method includes determining the critical dimension uniformity by measuring the various parameters in the post-processed substrate and comparing the measurements to libraries of functions to determine the critical dimensions. This is a time consuming and difficult method which is computationally extensive and typically includes significant inaccuracies. An exemplary metrology method may use a process map to describe how the after-etch process varies across the wafer. The process map is based on the CD critical dimension measurements of anchor features obtained using a CDSEM tool.

The present invention seeks to provide an improved way to determine a contribution of a processing apparatus is to a parameter of a processed substrate and also seeks to provide an improved calibration and control techniques.

SUMMARY

The present invention provides a method and apparatus according to the appended claims.

Disclosed herein is a method for determining a contribution of a processing apparatus to a fingerprint of a parameter across a first substrate, the method comprising: obtaining a delta image which relates to the difference between a first pupil image associated with inspection of a first feature on the substrate and a second pupil image associated with inspection of a second feature on the substrate, wherein the first and second features have different dose sensitivities; determining a rate of change of the difference in response to a variation of a dose used to form said first and second features; selecting a plurality of pixels comprised within the delta image having a rate of change above a predetermined threshold; and determining the contribution using the determined rate of change and the delta image restricted to the plurality of pixels.

The contribution may be expressed as one or more values of an effective dose.

The first pupil image and second pupil image may form a pair of pupil images. The method may further comprise: obtaining differences for a plurality of pairs of pupil images. A dose may be used for forming features associated with a first pair of pupil images may be different to a dose used for forming features associated with a second pair of pupil images.

The method may further comprise using the difference between the first pair of pupil images and difference between the second pair of pupil images to determine an image intensity vs dose curve and using the image intensity vs dose curve to determine the rate of change.

The rate of change may be the derivative of the image intensity vs dose curve.

Obtaining the difference between the first and second pupil image may comprise summing image data from the first and second pupil images and subtracting the summed image data from the first pupil image from the summed image data from the second pupil image.

The data maybe scatterometry data. The first pupil image and second pupil image may comprise a distribution of scatterometry intensity data. The delta image may comprise a plurality of pixels and the method further comprises: selecting pixels from within the delta image and determining the rate of change using the selected pixels. The method may further comprise selecting pixels which have a rate of change above a predetermined threshold.

The first feature and the second feature may be adjacent to one another on the substrate. The first pair of pupil images are selected from a first substrate area, and the second pair of pupil images are selected from a second substrate area, wherein the first and second substrate areas have received different doses.

Either of the first or second feature may be a line feature. Either of the first or second features may be a space feature. The first feature may be an inversion of the second feature.

The substrate may comprise a plurality of first and second features. The substrate may be a Focus Exposure Matrix having a plurality of first and second features distributed across the surface thereof and in a plurality of different exposure zones, wherein each of the exposure zones receives a different dose. The exposure zones may be randomly dispersed across the surface of the substrate.

The substrate may have been processed using one or more of the following processing steps: a deposition, bake, coat, develop, exposure and etch.

The one or move values of effective dose may be determined by dividing the summed intensity of the delta image, or part thereof, by the rate of change.

The method may further comprise: determining an effective dose map using the one or more values of effective dose.

The method may further comprise: subtracting the effective dose from the delta pupil image to provide a pure process image data which is representative of the non-exposure processing steps.

The method may further comprise: obtaining pure process image data for a plurality of locations across the wafer to provide a pure process map.

The method may further comprise: providing a second substrate;
obtaining a difference between a plurality of second substrate pupil pairs to provide a plurality of second substrate delta images; using the determined contribution to generate a second substrate metrology map for the second substrate.

The second substrate may be different from the first substrate. The second substrate may be a critical dimension wafer. The second substrate metrology map may be an intensity map comprising intensity data from the plurality of second substrate delta images.

The second substrate metrology map may comprise a second substrate effective dose map.

The method may further comprise: summing the pure process map and second substrate metrology map to provide an effective second substrate process map.

The method may further comprise: using the effective second substrate process map to monitor and/or control one or more parameters of a fabrication process.

The parameter may relate to an exposure system.

The method may further comprise: determining the critical dimensions or critical dimension uniformity of the second or a third substrate using the effective second substrate process map.

The parameter may relate to an intrafield effect.

The method may further comprise: determining the critical dimensions or critical dimension uniformity of features on a substrate using the one or more values of the effective dose associated with the contribution.

Also described herein is a lithographic apparatus comprising: a processor configured to execute the method according to any of the methods described herein. Also described, is a computer program comprising instructions which, when executed on at least one processor, cause the at least one processor to control an apparatus to carry out any of the methods described herein. Also described herein is a carrier containing the above referenced computer program. The carrier may be one of an electronic signal, optical signal, radio signal, or non-transitory computer readable storage medium.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
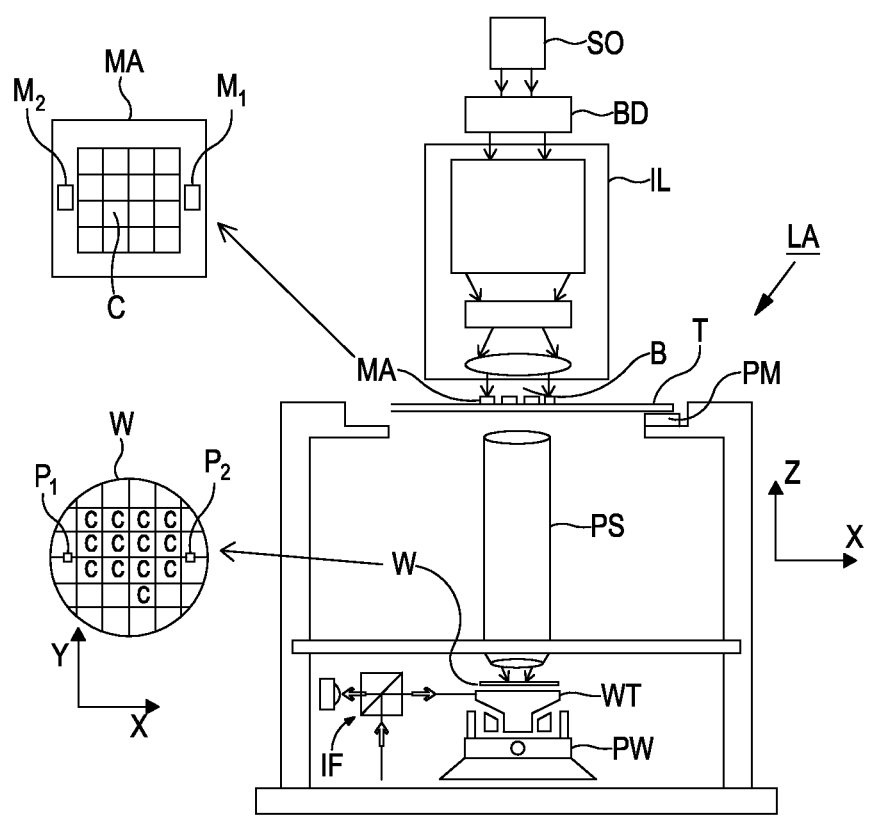
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
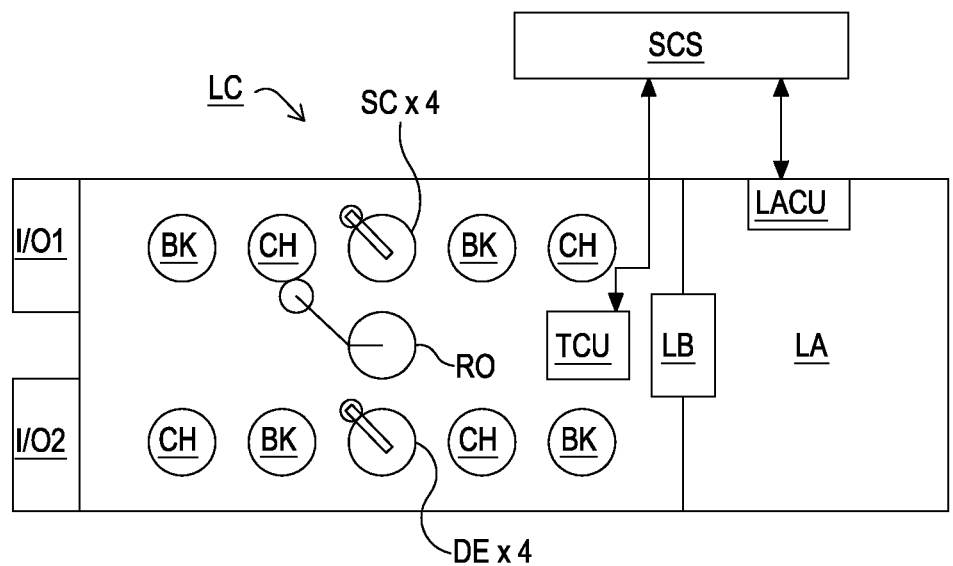
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
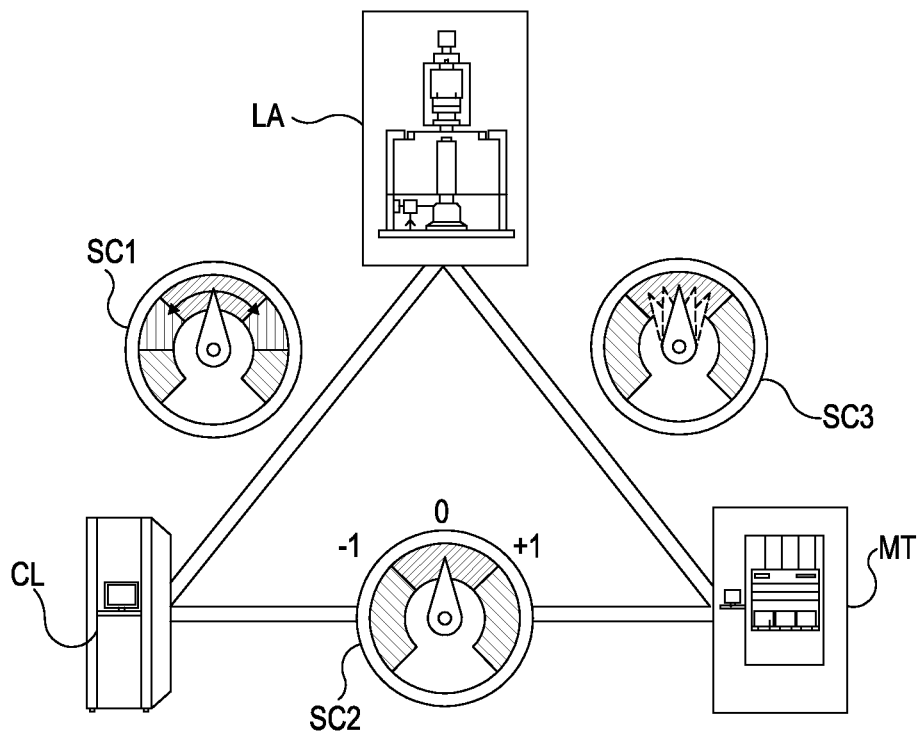
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1628164A, incorporated herein by reference in their entirety. Aforementioned scatterometers may measure gratings using light from soft x-ray and visible to near-IR wavelength range.

The scatterometer MT may be an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

The scatterometer MT may be a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

The scatterometer MT may be an ellipsometric scatterometer. The ellipsometric scatterometer allows for determining parameters of a lithographic process by measuring scattered radiation for each polarization states. Such a metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000, 229, 13/033,135, 13/533,110 and 13/891,410 incorporated herein by reference in their entirety.

The scatterometer MT may be adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1628164, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to as 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

The focus and dose of the radiation directly affect the parameters of the patterns or structures that are exposed on the substrate. Parameters that can be measured using a scatterometer are physical properties of structures that have been printed onto a substrate such as the critical dimension (CD) or sidewall angle (SWA) of, for example, a bar-shaped structure. The critical dimension is effectively the mean width of a structure, for example, such as a bar, space, dot or hole, depending on the measured structures. The sidewall angle is the angle between the surface of the substrate and the rising or falling, portion of the structure.

In addition, mask shape corrections, for example, such as focus corrections for correcting for the bending of a mask, can be applied if scribe lane structures are used with a product mask for focus measurements.

Focus and dose have been determined simultaneously by scatterometry, or scanning electron microscopy, from one-dimensional structures in the mask pattern, which gives rise to one-dimensional markers on the substrate, from which measurements are taken. A single structure can be used as long as that structure, when exposed and processed, has a unique combination of critical dimension and sidewall angle measurements for each point in a focus energy matrix (FEM). If these unique combinations of critical dimension and sidewall angle are available, the focus and dose values can be uniquely determined from these measurements.

Figure 4:
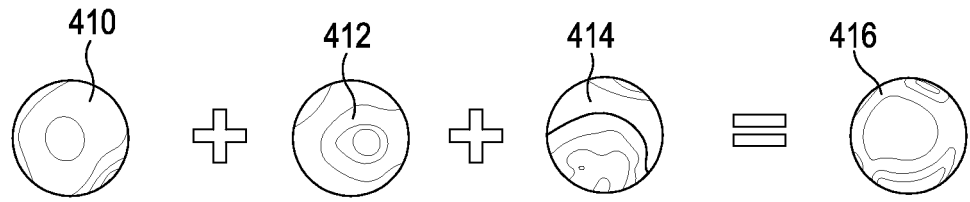
FIG. 4 shows a schematic representation of a process specific fingerprint.

As shown in FIG. 4, a substrate is typically fabricated in several sequential stages including a film deposition 410, a bake, exposure and development 412 and etch 414. Each of these stages, and any others, can affect the dimensions of the features created on that surface. As such the critical dimension uniformity across the wafer can be affected by each stage. As demonstrated in FIG. 4, the errors created in each stage accumulate to provide an overall wafer error pattern or process specific fingerprint.

Understanding the process specific fingerprint and associated critical dimensions is important. It provides an insight in to how the different processes might contribute and be adjusted to improve the critical dimension uniformity. The methods described herein use metrology data to understand and characterise the fingerprint of a parameter across a substrate. This information may be used to determine the contribution of a processing apparatus. Where a contribution from a processing apparatus leads to a reduction in critical dimension or critical dimension uniformity, it may be possible to correct for the reduction in critical dimension by adjusting the exposure. Thus, the contribution may be expressed as one or more values of an effective dose. The effective dose may be considered to be a process variation which impacts critical dimension, modelled as if a dose variation would be responsible.

The processing apparatus may, for example, be a lithographic apparatus. However, other process apparatuses and contributions may be determined. For example, the processing apparatus may be any within the processing environment or an amalgamation of multiple processing apparatuses. In one example, the contribution may relate to all of the process apparatuses other than the lithographic apparatus. Alternatively, or additionally, the contribution may be any contribution other than the effective dose. For example, the contribution may be a non-uniformity in the intrafield distribution.

The effective dose can be determined across a wafer at different locations to provide an effective dose map. The effective dose map may provide cross wafer representation of the effective dose and used to determine how the exposure may be corrected to account for the process variations. The effective dose map may be used for other purposes. For example, the effective dose map may be used to determine the contribution of other processes. The effective dose map may be subtracted from an intensity map of the wafer to provide the contribution of the all of the processes other than the exposure, wherein the intensity map comprises to intensity metrology data representative of the processed wafer. The intensity map may comprise a collection of delta pupil images, as described below.

The methods described herein provide a way of determining a complete effective process map. The effective process map may provide data or a representation relating to the process variations which contribute to critical dimension. The effective process map may comprise an effective dose map and a pure process map. The pure process map may calculated from the delta images once the effective dose has been removed. For example, the effective process map may capture the process variations caused by, for example, the deposition, bake, exposure, develop and etch which apply to a given layer.

Either or both of the effective dose map and effective process map may be used to determine corrective actions by which one or more parameters of a process step may be corrected. For example, the effective dose map may be used as an input to control one or more dose control apparatus, systems, methods or recipes. The effective process map can be used as a process monitoring map, or as an input to a defect prediction model. The effective process map may be used as a corrective process map or reveal information about a processed substrate.

The metrology data may comprise two or more intensity signals. The intensity signals may be measured using one or more metrology apparatus, as described above. The metrology apparatus may be diffraction based metrology. The diffraction based metrology may be scatterometry based metrology.

The intensity signals may be used differentially. By obtaining a first intensity signal of a first feature, and an intensity signal of a second feature, it is possible to obtain a contrasting image between the two images. The two images may contrast by virtue of having different dose sensitivities. Hence, a first feature may have a first dose sensitivity and a second feature may have a second dose sensitivity in which the first dose sensitivity and the second dose sensitivity are different. Subtracting the two dose sensitivities provides a differential, or delta, image of the intensity at a given location.

An advantage of obtaining a differential of the intensities is that it allows the common aspects of the processing errors to be removed. That is, subtracting the images from one another helps remove differences which are not related to dose sensitivities of the features and which are common to both of the first and second features. This is useful where the first and second features are provided on the same layer having the same stack underneath both. The remaining component in the delta pupil image can be related to a divergence in critical dimension and provide an indication as to what correction may be needed to account for the process variation. As such, the delta image intensity can be used to provide an effective dose at a particular location which can be used to adjust the exposure accordingly and improve critical dimension at that location.

The difference in intensity in the first and second features can be provided with the correct selection of the features. The selection of features may be done using prior knowledge of the dose sensitivity for a particular feature. In one instance, a line may be selected as the first feature and a space selected as the second feature, however, other contrasting features may be known. The first and second features may be selected to maximise the difference in the intensity contrast. For example, the first and second features, or their respective intensity images, may be inverted with respect to each other. Selecting inverted features or inverted intensity responses in this way helps increase the intensity signal provided by the delta image which helps increase the signal to noise ratio. In some examples, the method may employ different feature types within a single location.

Another advantageous technique is to select pixels from the delta pupil image based on a good dose response which is indicative of poor critical dimension. In doing so, the signal to noise ratio can be increased, thereby improving the quality of the analysis. This is described further below in connection with FIG. 5.

Figure 6:
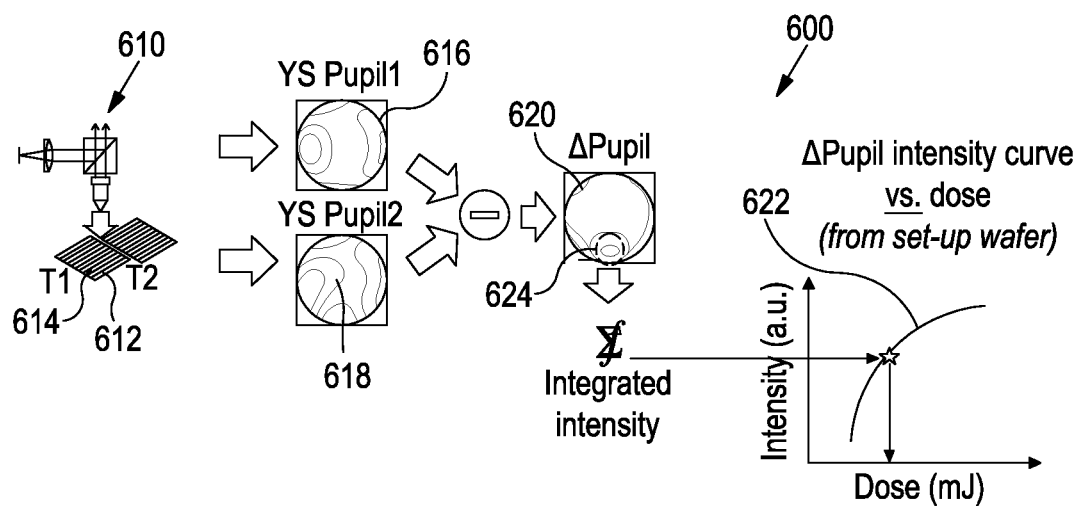
FIG. 6 provides a pictorial representation of the method of FIG. 5.

In one example, the different delta images are obtained from different locations across the surface of the wafer. The different locations may have received different doses. Thus, the wafer may have received a first dose at a first location and a second dose at a second location, where the first and second doses are different to each other. By obtaining delta images at a plurality of locations across the wafer, assuming that the dose differs between the locations, a dose sensitivity map can be generated. The delta images from the different locations may be used to determine a curve of delta pupil intensity vs dose (as shown in FIG. 6). This may be referred to as a calibration curve giving expression to a rate of change of pixel intensities obtained from the delta image, as a function of received dose. Hence, the rate of change may be determined from the plurality of delta images.

The rate of change of the difference in response to the variation of a dose used to form the first and second features may provide information as to the effective dose which has been received at a particular location on a substrate. Thus, where a particular dose is known to have been used at a particular location on a substrate, dose sensitivity, as represented by the rate of change and/or calibration curve, may be used to determine the actual dose which has been received at that location.

As described above, disclosed herein are methods and apparatuses for determining a characteristic of a processed wafer which has undergone a plurality of processing steps. The characteristic may be indicative of a contribution of a processing apparatus to the fingerprint and/or a critical dimension and/or critical dimension uniformity, or another measurement.

Figure 5:
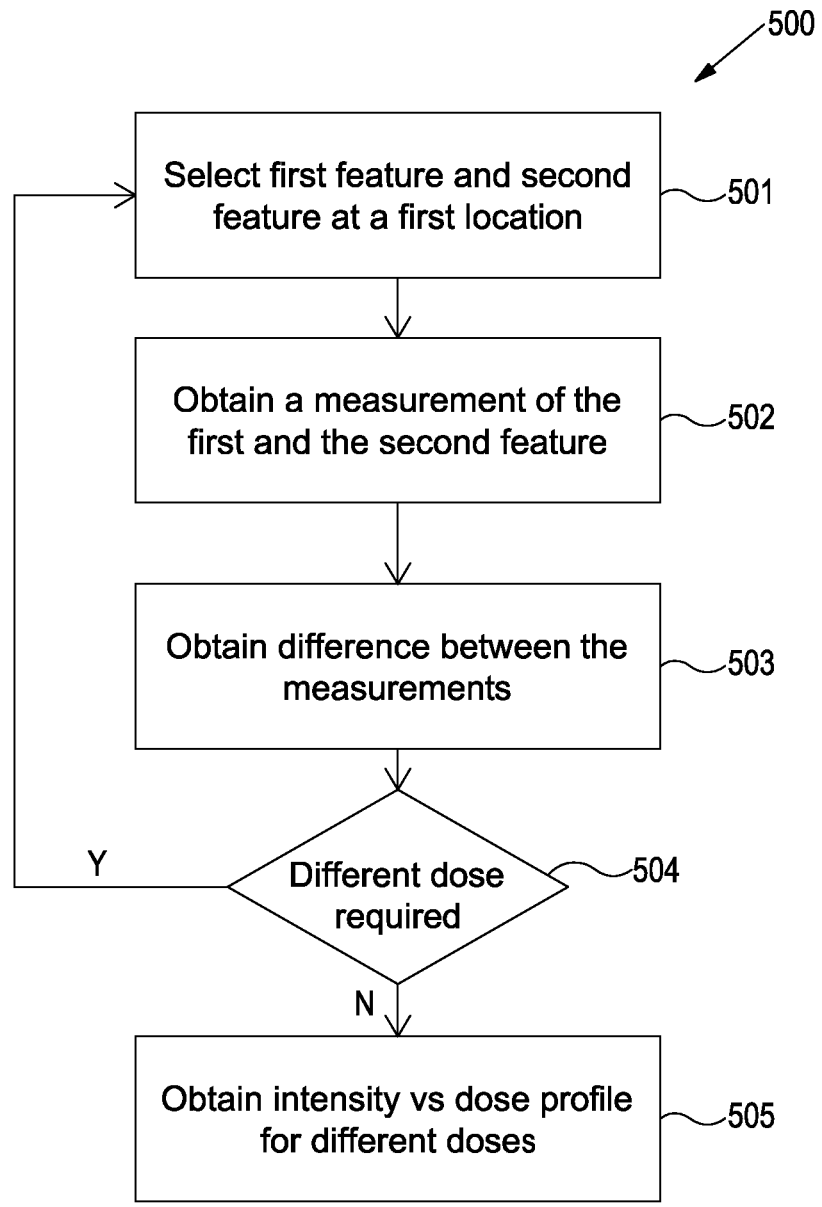
FIG. 5 provides a schematic flow diagram of a method for determining the contribution of a processing apparatus to a fingerprint of a parameter across a first substrate.

FIG. 5 shows the principal steps of a method 500 for determining a contribution of a processing apparatus to a fingerprint of a parameter across a first substrate. The method comprises: selecting a first feature and a second feature at a first location 501; obtaining a measurement of the first and second features 502; obtaining the difference between the measurements of the first feature and the second feature 503 to provide a delta image. Once a delta image has been obtained, a determination is made as to whether a further measurement is required at a different dose 504. The number of delta images required at the different doses can be predetermined. The number of required doses and corresponding measurements will vary from application to application, but sufficient measurements should be taken to allow a rate of change to be calculated. The number of measurements may be tracked on a counter or other register.

The dose may vary in a range of between plus or minus 10% of a target dose. Hence, for a target dose of 10 mJ, the range may be between 9 mJ and 11 mJ, in addition to normally expected variations.

Once the required number of delta pupil images has been gathered, the intensity vs dose for the delta images may be obtained 505, collated and stored. The intensity vs dose may be represented by a data set or similar representation sufficient to allow the rate of change to calculated. In some examples, the intensity data vs dose data may be thought of as a curve which may be referred to as a calibration curve. The derivative of this curve will provide the rate of change of difference in response to the variation of dose used to form the first and second features.

The method in FIG. 5 may also be thought of as providing a dose sensitivity map of intensity data using metrology data taken from substrate. Further, the method may be considered to be part of a method of calibration of the exposure dose for a lithographic apparatus.

As described above, the method may include determining a contribution of a processing apparatus to a fingerprint of a parameter across a substrate. This is described in more detail below. The contribution may be expressed as one or more values of an effective dose for a wafer.

The process of FIG. 5 may be carried out whenever is necessary. As the fingerprint of the parameter across the substrate may be process specific, it is possible that the rate of change and/or intensity vs dose data is obtained and/or determined at the introduction of a new process. However, it will be appreciated that the method may be repeated at suitable intervals throughout the life of a process. This may be carried out at predetermined intervals, or as a reaction to a data indicating the process fingerprint may have altered due to changes elsewhere in the processing system which has created a drift in the processing fingerprint.

The first and second pupil images may be conveniently referred to as a pair of images. Thus, a first pair of pupil images may comprise a first pupil image and second pupil image, and a second pair of pupil images may comprises a third pupil image and a fourth pupil image, and so on. Hence, the method may further comprise: obtaining differences for a plurality of pairs of pupil images, wherein a dose used for forming features associated with a first pair of pupil images is different to a dose used for forming features associated with a second pair of pupil images. The number of pairs of pupil images will typically be between 2 and N pupils, where N is an integer. N may be any suitable number which provides enough data for the rate of change to be calculated accurately.

Obtaining the difference between the first and second pupil image may comprise summing image data from the respective first and second pupil images and subtracting the summed image data from the first pupil image from the summed image data from the second pupil image.

The metrology data relating to the pupil images may relate to an optical measurement or optical metrology. In one example, diffraction based metrology may be used. The diffraction based metrology may comprise a scatterometry based technique, as is well known in the art. The use of an optical measurement method provides a replacement for the commonly used critical dimension scanning electron microscope measurements which can provide used on or after lithography or development inspection and is generally a destructive way of measurement. In state of the art methods, obtaining a process map typically involves using different techniques to determine the different features characteristics. However, these may have different critical dimension responses due to the process because the sensitivities are different. An advantage of using an optical techniques and providing the delta image, means the process variation will be feature invariant due to the subtraction of the two images which are only differentiated by the difference in the dose sensitivity. A further advantage of using optical techniques, in particular diffraction based metrology and scatterometry, is that it allows for a reasonably quick data acquisition.

As will be appreciated from the description above, the first pupil image and second pupil images comprise a distribution of scatterometry intensity data. In one example, the first and second pupil images each comprise a plurality of pixels and the method further comprises: selecting pixels from within the delta pupil image and determining the difference using the selected pixels. The selected pixels may have a rate of change dose sensitivity above a predetermined threshold. The predetermined threshold will be application specific but will generally be set using experience and knowledge of the required intensity data needed for a particular system and/or feature. For example, the threshold may correspond to a critical dimension or yield threshold.

To provide the different dose variations, the exposure dose can be varied across the wafer. The dose variations may be randomised across the wafer. Randomising the dosage amounts helps reduce the build-up of errors in the fingerprint of the effective dose. Thus, the method may include selecting a first pair of pupil images from a first substrate area, and selecting a second pair of pupil images from a second substrate area, wherein the first and second substrate areas have received different doses. The first feature and the second feature may be adjacent to one another on the substrate to ensure that both features have received the same dose.

The substrate from which the calibration curve/rate of change is determined may be specifically provided for this purpose. The substrate may comprise a matrix of exposures performed at a plurality of focus and dose settings of the lithographic apparatus. A known substrate is a Focus Exposure Matrix, FEM is typically used to determine the focus and dose sensitivities of features created by the lithographic process. The features may include, for example, lines and spaces/trenches, distributed across the surface of the wafer. Thus, the method may comprise using a substrate comprising a plurality of first and second features which are the same across the wafer and distributed across a plurality of exposure zones. By exposure zones, it will be appreciated that each exposure zone has received a different exposure dose compared to another exposure zone.

FIG. 6 shows a pictorial representation 600 of the method described above. Thus, there is provided a metrology system 610 which is operable to obtain intensity images from the surface of the substrate. As described above, the metrology system may comprise an optical system such as a scatterometer. A plurality of first 612 and second 614 features are provided on the substrate and a plurality of pupil images including a first pupil image 616 and a second pupil image 618 are obtained. The images 616, 618 are subtracted from one another to provide a delta intensity image 620 which relates to a dose sensitivity at the location of the first 616 and second 618 pupils. Obtaining the delta images for a plurality of dose variations allows the interrelationship of intensity vs dose to be determined and optionally depicted as a curve 622. Determining a rate of change of this variation can then be used to determine the contribution of a process apparatus.

As mentioned above, specific portions or pixels which show a good dose response may be selected from within the delta pupil image. Hence, the area 624 may be selected and used to provide the delta pupil intensity value.

The contribution which is determined may be expressed as an effective dose. The effective dose may be determined by multiplying the inverse of the rate of change and summed selected pixel intensities of a delta image. Hence, the effective dose may equal the summed intensities of the delta image, or parts thereof, divided by the rate of change.

The method may further comprise determining an effective dose map. The effective dose map may be achieved by determining an effective dose at a plurality of locations across the wafer. The effective dose map provides a measure of the dose which is effectively received at each location across the substrate due to the process fingerprint. Once determined, the effective dose map may be stored in a suitable memory for use in other processes, as described below.

In some applications it may be possible and useful to determine other contributors to the fingerprint of a process. Disclosed herein is a method of determining a process map which relates to an estimation of the process variation across a substrate. The process map may represent the process variation which occurs by all process steps other than the variation in effective dose. This may be referred to as a pure process map. In the present case, the determination of the pure process map may be achieved by obtaining the effective dose for a location, for example by using the effective dose as described above, and subtracting this from metrology data, e.g. the delta image, at that location. In one example, the effective dose may be obtained from a delta image and subtracted from that delta image. The remaining intensity will relate to the variation caused by the process variation other than the effective dose. Once the effective dose has been subtracted, a low order fingerprint can be calculated by performing a low order fitting to estimate the delta fingerprint. A suitable function for determining the low order fitting is to use Zernike polynomials. Low order fitting is enough to estimate the process contribution from, for example, etch or film deposition, because it has a low frequency fingerprint across the wafer.

The effective dose map and/or pure process map may be used to determine provide monitoring or adjustments to one or more pieces of processing apparatus. For example, the effective dose map may be used to provide control, calibration or correction of a dose provided by a source apparatus. Thus, the effective dose map may be used as part of a setup procedure of a particular process or recipe, or to calibrate the apparatus at given intervals or when required in accordance with metrology and performance measures.

The effective dose map and pure process map may also be used to determine an effective process map. The effective process map may provide the total contribution of the effective dose and the pure process to the variation across the substrate which may relate to the critical dimension uniformity.

The effective process map may be used to determine the critical dimensions or critical dimension uniformity of a second or a further substrate. The second substrate may be a critical dimension substrate. The effective process map may be used as a process monitoring map or as an input to a defect prediction model. In the latter, a suitable algorithm may be used to convert effective process map comprising intensity data into a critical dimension data for different features. In one example, a feature N may have a dose sensitivity of alpha. In which case, a predicted critical dimension of feature N may equal the effective dose multiplied by alpha. The effective dose may be determined according to a method described herein.

Alternatively, or additionally, the effective dose data may be converted to critical dimension data using one or more different metrology types, such as a critical dimension scanning electron microscopy, CDSEM. Hence, once the effective dose is determined, the dose can be converted into CD given a CD-dose sensitivity of any feature in the wafer (independently defined either from simulation or experiment).

Figure 7:
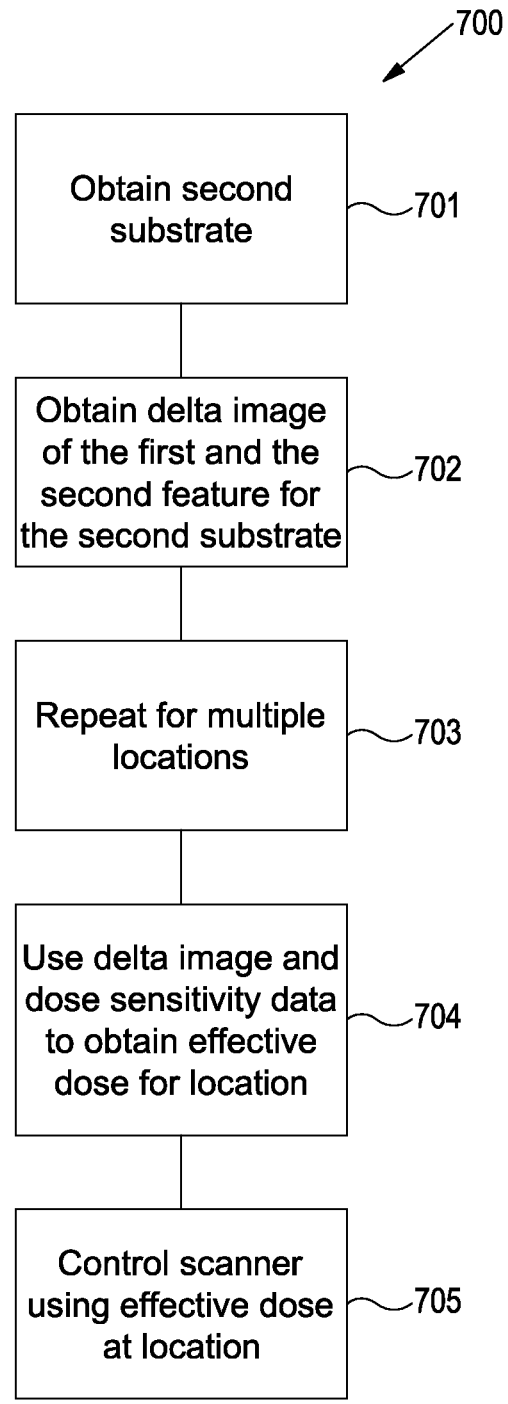
FIG. 7 provides a schematic flow diagram for controlling a piece of processing apparatus using an effective dose map.

FIG. 7 shows a method for providing an effective process map for a substrate. The substrate may be a critical dimension wafer. The process 700 begins with the provision of a suitable substrate 701 upon which the method is to be carried out. The substrate is typically different to the first substrate described above used to obtain the dose sensitivities and determine the rate of change. The substrate may be substantially similar to the first substrate but may not have received the randomised exposure dose across the substrate. Hence, the substrate may include corresponding features, but received a substantially uniform cross wafer exposure. By substantially uniform, it will be appreciated that this does not preclude minor local or cross wafer variations which may be ordinarily experienced. As the method is applicable to a given process, in particular, the dose sensitivities of a process, the second substrate will have undergone substantially the same process.

The second substrate may be measured to obtain at least two pupil images on two or more targets such that a differential or delta pupil image can be provided 702 as described above. This process is then repeated at multiple locations 703 for as many locations as necessary to provide a metrology map. The metrology map may be an intensity map comprising intensity data from the second substrate delta pupil images. The metrology map may have sufficient data points to provide suitable resolution for use as a calibration tool for controlling the scanner.

Once the delta images have been obtained, the rate of change of variation is applied to each of the delta images to provide an effective dose map 704. In addition to this, the pure process map, as described above, may be added to the effective dose map to provide a full effective process map. Hence, the method may comprise summing the pure process map and second substrate metrology map to provide an effective second substrate process map.

As noted above, the effective second substrate process map may be used to monitor and/or control one or more parameters of a fabrication process 705. The parameter relates to an exposure system.

The contribution which is described above has generally been related to processing apparatus and the effect this has on the dose sensitivity across the wafer. However, it will be appreciated that there may be intrafield variations in the exposure source and/or patterning device. Identifying sufficient first and second features across the exposure field, the delta image pupils may be used to estimate these variations. Once the variations have been determined, a calibration can be carried out to convert the measured intensity into a dose unit and critical dimension measurement.

As will be appreciated, the methods described above may be carried out in connection with or by a lithographic apparatus. The lithographic apparatus LA may any suitable one as known in the art. As described above, the lithographic apparatus may comprise a computer system CL configured to control and/or monitor the process steps. The computer system may include one or processors configured to execute the or any part of the methods described herein. The processors may be distributed processors so as to be distributed between machines and/or locations. Hence, for example, a step or steps of the method may be carried out a first location, and a second part or parts of the method may be carried out in a second location, For example, the obtaining of the metrology data, i.e. the pupil images, may be carried out at the same location as the lithographic apparatus LA. Other parts of the method, such as the determination of effective dose or process map may be carried out at a different location and by an alternative computer system. It will be further appreciated that the method may be embodied in a computer program which comprises instructions which, when executed on at least one processor, cause the at least one processor to control an apparatus to carry out any or part of the methods described herein. Additionally disclosed is a carrier containing the computer program. The carrier may be one of an electronic signal, optical signal, radio signal, or non-transitory computer readable storage medium.

Further embodiments of the invention are disclosed in the list of numbered clauses below:
1. A method for determining a contribution of a processing apparatus to a fingerprint of a parameter across a first substrate, the method comprising:
obtaining a delta image which relates to the difference between a first pupil image associated with inspection of a first feature on the substrate and a second pupil image associated with inspection of a second feature on the substrate, wherein the first and second features have different dose sensitivities;
determining a rate of change of the difference in response to a variation of a dose used to form said first and second features; and determining the contribution using the determined rate of change and the delta image.

2. A method according to clause 1, wherein the contribution is expressed as one or more values of an effective dose.

3. A method according to clause 1 or 2, wherein the first pupil image and second pupil image form a pair of pupil images, the method further comprising: obtaining differences for a plurality of pairs of pupil images, wherein a dose used for forming features associated with a first pair of pupil images is different to a dose used for forming features associated with a second pair of pupil images.

4. A method according to clause 3, further comprising using the difference between the first pair of pupil images and difference between the second pair of pupil images to determine an image intensity vs dose curve and using the image intensity vs dose curve to determine the rate of change.

5. A method according to clause 4, wherein the rate of change is the derivative of the image intensity vs dose curve.

6. A method according to any preceding clause, wherein obtaining the difference between the first and second pupil image comprises summing image data from the first and second pupil images and subtracting the summed image data from the first pupil image from the summed image data from the second pupil image.

7. A method according to clause 6, wherein the data is scatterometry data.

8. A method according to clause 7, wherein the first pupil image and second pupil image comprise a distribution of scatterometry intensity data.

9. A method according to any preceding clause, wherein the delta image comprises a plurality of pixels and the method further comprises: selecting pixels from within the delta image and determining the rate of change using the selected pixels.

10. A method according to clause 9, further comprising: selecting pixels which have a rate of change above a predetermined threshold.

11. A method according to any preceding clause, wherein the first feature and the second feature are adjacent to one another on the substrate.

12. A method according to any of clauses 3 to 11, wherein the first pair of pupil images are selected from a first substrate area, and the second pair of pupil images are selected from a second substrate area, wherein the first and second substrate areas have received different doses.

13. A method according to any preceding clause, wherein either of the first or second feature is a line feature.

14. A method according to any preceding clause, wherein either of the first or second features is a space feature.

15. A method according to any preceding clause, wherein the first feature is an inversion of the second feature.

16. A method according to any preceding clause, wherein the substrate comprises a plurality of first and second features.

17. A method according to any clause 16, wherein the substrate is a Focus Exposure Matrix having a plurality of first and second features distributed across the surface thereof and in a plurality of different exposure zones, wherein each of the exposure zones receives a different dose.

18. A method according to clause 17, wherein the exposure zones are randomly dispersed across the surface of the substrate.

19. A method according to any preceding clause, wherein the substrate has been processed using one or more of the following processing steps: a deposition, bake, coat, develop, exposure and etch.

20. A method according to any of clauses 2 to 19, wherein the one or move values of effective dose are determined by dividing the summed intensity of the delta image, or part thereof, by the rate of change.

21. A method according to clause 20, further comprising: determining an effective dose map using the one or more values of effective dose.

22. A method according to clause 20 or 21, further comprising: subtracting the effective dose from the delta pupil image to provide a pure process image data which is representative of the non-exposure processing steps.

23. A method according to clause 22, further comprising: obtaining pure process image data for a plurality of locations across the wafer to provide a pure process map.

24. A method according to clause 23, further comprising:
   providing a second substrate;
   obtaining a difference between a plurality of second substrate pupil pairs to provide a plurality of second substrate delta images;
   using the determined contribution to generate a second substrate metrology map for the second substrate.

25. A method according to clause 24, wherein the second substrate is different from the first substrate.

26. A method according to clause 25, wherein the second substrate is a critical dimension wafer.

27. A method according to clause 25 or 26, wherein the second substrate metrology map is an intensity map comprising intensity data from the plurality of second substrate delta images.

28. A method according to clause 27, wherein the second substrate metrology map comprises a second substrate effective dose map.

29. A method according to any of clauses 24 to 28 when dependent on clause 22, further comprising: summing the pure process map and second substrate metrology map to provide an effective second substrate process map.

30. A method according to clause 29, further comprising: using the effective second substrate process map to monitor and/or control one or more parameters of a fabrication process.

31. A method according to clause 30, wherein the parameter relates to an exposure system.

32. A method according to clauses 29 to 31, further comprising: determining the critical dimensions or critical dimension uniformity of the second or a third substrate using the effective second substrate process map.

33. A method according to any preceding clause, wherein the parameter relates to an intrafield effect.

34. A method according to any of clauses 2 to 34, further comprising: determining the critical dimensions or critical dimension uniformity of features on a substrate using the one or more values of the effective dose associated with the contribution.

35. A lithographic apparatus comprising:
   a processor configured to execute the method according to any of clauses 1 to 34.

36. A computer program comprising instructions which, when executed on at least one processor, cause the at least one processor to control an apparatus to carry out the method according to any of clauses 1 to 34.

37. A carrier containing the computer program of clause 36 wherein the carrier is one of an electronic signal, optical signal, radio signal, or non-transitory computer readable storage medium.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for determining a contribution of a processing apparatus to a fingerprint of a parameter across a substrate, the method comprising:
    obtaining a delta image which relates to a difference between a first pupil image associated with inspection of a first feature on the substrate and a second pupil image associated with inspection of a second feature on the substrate, wherein the first and second features have different dose sensitivities;
    determining a rate of change of the difference in response to a variation of a dose used to form the first and second features;
    selecting a plurality of pixels comprised within the delta image having a rate of change above a predetermined threshold; and
    determining the contribution using the determined rate of change of the difference and the delta image restricted to the plurality of pixels.

2. The method as claimed in claim 1, wherein the contribution is expressed as one or more values of an effective dose.

3. The method as claimed in claim 2, wherein the one or more values of effective dose are determined by dividing a summed intensity of the delta image, or part thereof, by the rate of change of the difference.

4. The method as claimed in claim 2, further comprising determining critical dimensions or critical dimension uniformity of features on a substrate using the one or more values of the effective dose.

5. The method as claimed in claim 1, wherein the first pupil image and second pupil image form a pair of pupil images, and further comprising obtaining differences for a plurality of pairs of pupil images, wherein a dose used for forming features associated with a first pair of pupil images is different to a dose used for forming features associated with a second pair of pupil images.

6. The method as claimed in claim 5, further comprising using the difference between the first pair of pupil images and difference between the second pair of pupil images to determine an image intensity vs dose curve and using the image intensity vs dose curve to determine the rate of change of the difference.

7. The method as claimed in claim 6, wherein the rate of change of the difference is the derivative of the image intensity vs dose curve.

8. The method as claimed in claim 1, further comprising determining an effective dose map using one or more values of the contribution.

9. The method as claimed in claim 8, further comprising subtracting the one or more values of the contribution from the delta pupil image to provide a pure process image data which is representative of one or more non-exposure processing steps.

10. The method as claimed in claim 9, further comprising obtaining pure process image data for a plurality of locations across the substrate to provide a pure process map.

11. The method as claimed in claim 10, further comprising:
    obtaining a difference between a plurality of pupil image pairs for a further substrate to provide a plurality of further substrate delta images; and
    using the obtained difference to generate a metrology map for the further substrate.

12. The method as claimed in claim 11, wherein the further substrate is different from the substrate.

13. The method as claimed in claim 1, wherein the first feature is an inversion of the second feature.

14. A computer program product comprising a non-transitory computer-readable medium having instructions therein, which instructions, when executed by at least one processor, are configured to cause the at least one processor to at least:
    obtain a delta image which relates to a difference between a first pupil image associated with inspection of a first feature on a substrate and a second pupil image associated with inspection of a second feature on the substrate, wherein the first and second features have different dose sensitivities;
    determining a rate of change of the difference in response to a variation of a dose used to form the first and second features;
    selecting a plurality of pixels comprised within the delta image having a rate of change above a predetermined threshold; and
    determining a contribution of a processing apparatus to a fingerprint of a parameter across the substrate using the determined rate of change of the difference and the delta image restricted to the plurality of pixels.

15. The computer program product as claimed in claim 14, wherein the contribution is expressed as one or more values of an effective dose.

16. The computer program product as claimed in claim 14, wherein the first pupil image and second pupil image form a pair of pupil images, and the instructions are further configured to cause the at least one processor to obtain differences for a plurality of pairs of pupil images, wherein a dose used for forming features associated with a first pair of pupil images is different to a dose used for forming features associated with a second pair of pupil images.

17. The computer program product as claimed in claim 16, wherein the instructions are further configured to cause the at least one processor to use the difference between the first pair of pupil images and difference between the second pair of pupil images to determine an image intensity vs dose curve and use the image intensity vs dose curve to determine the rate of change of the difference.

18. The computer program product as claimed in claim 14, wherein the instructions are further configured to cause the at least one processor to determine an effective dose map using one or more values of the contribution.

19. The computer program product as claimed in claim 18, wherein the instructions are further configured to cause the at least one processor to subtract the one or more values of the contribution from the delta pupil image to provide a pure process image data which is representative of one or more non-exposure processing steps.

20. The computer program product as claimed in claim 14, wherein the first feature is an inversion of the second feature.

* * * * *